USA005552720A

United States Patent [19]

Lulla et al.

[11] Patent Number: 5,552,720
[45] Date of Patent: Sep. 3, 1996

[54] METHOD FOR SIMULTANEOUS PROGRAMMING OF MULTIPLE ANTIFUSES

[75] Inventors: Mukesh T. Lulla, Santa Clara; William D. Cox, Milpitas, both of Calif.

[73] Assignee: QuickLogic Corporation, Santa Clara, Calif.

[21] Appl. No.: 349,092

[22] Filed: Dec. 1, 1994

[51] Int. Cl.[6] ........................................ H01H 37/76
[52] U.S. Cl. ........................ 326/38; 327/525; 437/172
[58] Field of Search ..................... 326/38–39; 365/96; 437/170, 172, 922; 327/525

[56] References Cited

U.S. PATENT DOCUMENTS

| | | | |
|---|---|---|---|
| 3,987,287 | 10/1976 | Cox et al. | 235/152 |
| 4,207,556 | 6/1980 | Sugiyama et al. | 340/166 R |

(List continued on next page.)

FOREIGN PATENT DOCUMENTS

| | | | |
|---|---|---|---|
| 416903A2 | 3/1991 | European Pat. Off. | 21/320 |

OTHER PUBLICATIONS

El Gamal et al., "An Architecture for Electrically Configurable Gate Arrays", IEEE Journal of Solid–State Circuits, vol. 24, No. 2, Apr. 1989, pp. 394–398.

El–Ayat et al., "A CMOS Electrically Configurable Gate Array", IEEE International Solid–State Circuits Conference, 1988, Digest of Technical Papers, pp. 76–77.

*An Introduction to QuickLogic's pASIC Devices and SpDE Development Environment*, QuickLogic Corporation, Apr. 1991, pp. 1–12.

Birkner et al., "A Very High–Speed Field Programmable Gate Array Using Metal–to–Metal Antifuse Programmable Elements", paper presented at IEEE 1991 Custom Integrated Circuits Conference, Session 1, May 12, 1991, 7 pgs.

"Very High Speed Programmable ASIC Devices and Development Tools", QuickLogic Corporation, *pASIC Toolkit User's Guide*, Jun. 1991, 191 pgs.

Raffel et al., "A Wafer–Scale Digital Integrator Using Restructurable VSLI", IEEE Journal of Solid–State Circuits, vol. SC–20, No. 1, Feb. 1985, pp. 399–406.

"Very High Speed FPGAs", *QuickLogic Corporation 1994 Data Book*, QuickLogic Corporation, 1994, 72 pgs.

Brown et al., *Field–Programmable Gate Arrays*, Kluwer Academic Publishers, 1992, (Chapters 2 and 5, plus references) total 66 pgs.

Trimberger et al., *Field–Programmable Gate Array Technology*, Kluwer Academic Publishers, 1994, (Chapter 3, plus references) total 45 pgs.

"FPGA Data Book and Design Guide", *ACTEL Corporation 1994 Data Book*, 75 pgs.

*Primary Examiner*—Edward P. Westin
*Assistant Examiner*—Jon Santamauro
*Attorney, Agent, or Firm*—Skjerven, Morrill, MacPherson, Franklin & Friel; T. Lester Wallace

[57] ABSTRACT

A sequence of antifuses to be programmed is determined by: determining whether a first antifuse of an unordered list of antifuses to be programmed could be programmed last without programming any antifuses which are not to be programmed, determining whether a second antifuse of the unordered list could be programmed last without programming any antifuses which are not be programmed, and determining whether the first and second antifuses could be programmed simultaneously without programming any antifuses which are not to be programmed. In this way, a programming set of antifuses which could be programmed simultaneously is determined. Once determined, the antifuses making up the programming set are added to the head of an ordered list and are removed from the unordered list. By repeatedly determining programming sets of antifuses and adding each successive set of antifuses to an ordered list of antifuses, an antifuse programming sequence is developed. An FPGA is programmed by simultaneously programming the antifuses in each programming set, the programming sets being programmed in the order they appear in the ordered list.

10 Claims, 7 Drawing Sheets

Microfiche Appendix Included
(139 Microfiche, 1 Pages)

U.S. PATENT DOCUMENTS

| | | | |
|---|---|---|---|
| 4,433,331 | 2/1984 | Kollaritsch | 340/825.83 |
| 4,442,507 | 4/1984 | Roesner | 365/100 |
| 4,455,495 | 6/1984 | Masuhara et al. . | |
| 4,642,487 | 2/1987 | Carter . | |
| 4,670,749 | 6/1987 | Freeman | 340/825.85 |
| 4,698,589 | 10/1987 | Blankenship et al. | 324/158 R |
| 4,749,947 | 6/1988 | Gheewala | 324/73 R |
| 4,758,745 | 6/1988 | El Gamal et al. . | |
| 4,783,763 | 11/1988 | Bergman | 365/94 |
| 4,786,904 | 11/1988 | Graham, III et al. | 340/825.83 |
| 4,857,774 | 8/1989 | El-Ayat et al. . | |
| 4,870,302 | 9/1989 | Freeman . | |
| 4,873,459 | 10/1989 | El Gamal et al. . | |
| 4,899,205 | 2/1990 | Hamdy et al. . | |
| 4,910,417 | 3/1990 | El Gamal et al. . | |
| 4,910,418 | 3/1990 | Graham et al. . | |
| 4,924,287 | 5/1990 | Orbach . | |
| 4,933,898 | 6/1990 | Gilberg et al. | 365/53 |
| 4,945,267 | 7/1990 | Galbraith . | |
| 4,949,084 | 8/1990 | Schwartz et al. | 340/825.83 |
| 4,963,770 | 10/1990 | Keida . | |
| 4,969,124 | 11/1990 | Luich et al. | 365/201 |
| 4,972,105 | 11/1990 | Burton et al. . | |
| 5,003,200 | 3/1991 | Sakamoto . | |
| 5,008,855 | 4/1991 | Eltoukhy et al. | 365/96 |
| 5,015,885 | 5/1991 | El Gamal et al. . | |
| 5,049,969 | 9/1991 | Orbach et al. . | |
| 5,055,718 | 10/1991 | Galbraith et al. . | |
| 5,070,384 | 12/1991 | McCollum et al. . | |
| 5,073,729 | 12/1991 | Greene et al. . | |
| 5,083,083 | 1/1992 | El-Ayat et al. | 324/158 R |
| 5,095,228 | 3/1992 | Galbraith et al. . | |
| 5,099,149 | 3/1992 | Smith . | |
| 5,126,282 | 6/1992 | Chiang et al. | 437/172 |
| 5,130,777 | 7/1992 | Galbraith et al. . | |
| 5,132,571 | 7/1992 | McCollum et al. . | |
| 5,134,457 | 7/1992 | Hamdy et al. . | |
| 5,140,554 | 8/1992 | Schreck et al. | 365/201 |
| 5,166,556 | 11/1992 | Hsu et al. . | |
| 5,172,014 | 12/1992 | El-Ayat et al. . | |
| 5,187,393 | 2/1993 | El Gamal et al. . | |
| 5,191,241 | 3/1993 | McCollum et al. . | |
| 5,194,759 | 3/1993 | El-Ayat et al. . | |
| 5,196,724 | 3/1993 | Gordon et al. | 257/530 |
| 5,198,705 | 3/1993 | Galbraith et al. . | |
| 5,200,632 | 4/1993 | Lee . | |
| 5,208,530 | 5/1993 | El-Ayat et al. | 324/158 R |
| 5,220,213 | 6/1993 | Chan et al. . | |
| 5,223,792 | 6/1993 | El-Ayat et al. | 324/158 R |
| 5,243,226 | 9/1993 | Chan . | |
| 5,272,388 | 12/1993 | Bakker | 365/96 |
| 5,294,846 | 3/1994 | Paivinen . | |
| 5,302,546 | 4/1994 | Gordon et al. | 437/170 |
| 5,309,091 | 5/1994 | El-Ayat et al. | 324/158 R |
| 5,316,971 | 5/1994 | Chiang et al. | 437/170 |
| 5,317,698 | 5/1994 | Chan | 395/325 |
| 5,327,024 | 7/1994 | Cox . | |
| 5,341,030 | 8/1994 | Galbraith . | |
| 5,341,043 | 8/1994 | McCollum . | |
| 5,341,092 | 8/1994 | El-Ayat et al. | 324/158 R |
| 5,349,248 | 9/1994 | Parlour et al. . | |
| 5,371,414 | 12/1994 | Galbraith | 326/38 |
| 5,412,261 | 5/1995 | Whitten | 326/38 |

X, Y = already programmed

Z = antifuse to be programmed

L = antifuse inadvertently programmed

✸ = indicates antifuse already programmed

◯ = indicates antifuse being programmed

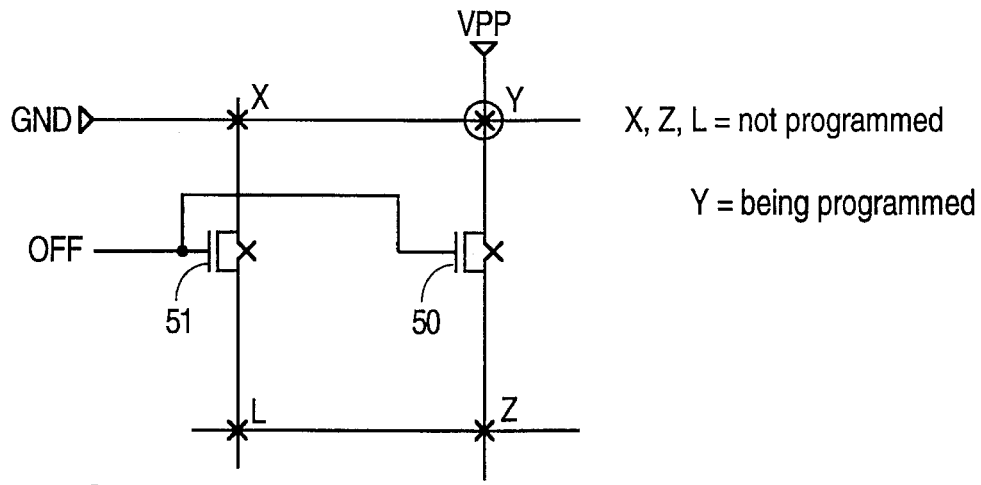
FIG. 6A    Program Y First
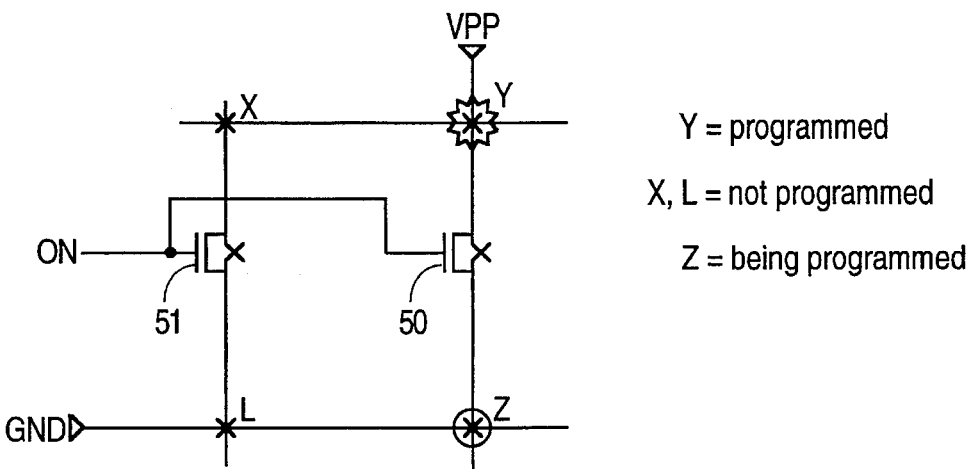
FIG. 6B    Program Z Second
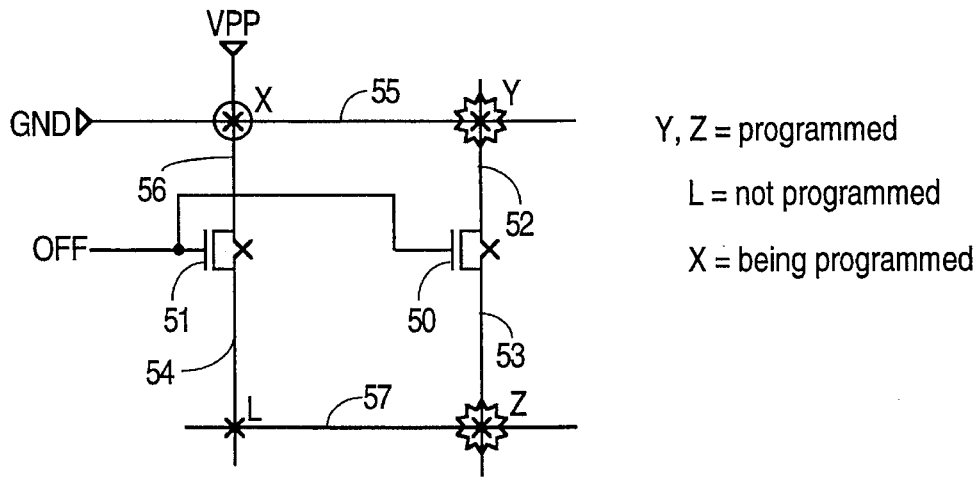
FIG. 6C    Program X Last

METHOD FOR SIMULTANEOUS PROGRAMMING OF MULTIPLE ANTIFUSES

CROSS REFERENCE TO MICROFICHE APPENDIX

The microfiche Appendix, which is a part of the present disclosure, entails 2 sheets of microfiche having a total of 145 frames. The microfiche appendix contains a software embodiment of a method in accordance with the present invention. A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights.

FIELD OF THE INVENTION

This invention relates to the programming of antifuses.

BACKGROUND INFORMATION

A field programmable device (such as a so-called "field programmable gate array" or "FPGA") is a versatile integrated circuit chip, the internal circuitry of which may be configured by an individual user to realize a user-specific circuit. To configure an FPGA, the user configures an on-chip interconnect structure of the FPGA so that selected input leads and selected output leads of selected on-chip logic components are connected together in such a way that the resulting circuit is the user-specific circuit desired by the user. The on-chip logic components may be located in a plurality of "modules", each of the modules containing an identical subgroup of the components.

FIG. 1 (Prior Art) is a simplified top down diagram illustrating a center part of an FPGA 1. FPGA 1 comprises a plurality of modules, a plurality of horizontal wires, a plurality of vertical wires, a plurality of cross antifuses, a plurality of horizontal pass antifuses, and a plurality of vertical pass antifuses. One way to connect the output wire 2 of module 3 to the input wire 4 of module 5 is to program cross antifuse 6, cross antifuse 7, horizontal antifuse 8, cross antifuse 9, and cross antifuse 10. An electrical connection is therefore established from output wire 2, through programmed cross antifuse 6, through vertical wire 11, through programmed cross antifuse 7, through horizontal wire 12, through programmed horizontal antifuse 8, through horizontal wire 13, through programmed cross antifuse 9, through vertical wire 14, through programmed cross antifuse 10, and to input wire 4 of module 5. For additional general background information on FPGAs the reader is referred generally to: U.S. Pat. Nos. 5,122,685, 5,327,024 and 4,873,459; the 1994 QuickLogic Data Book; the 1994 Actel Data Book; and the book entitled "Field-Programmable Gate Arrays" by Stephen Brown et al., Kluwer Academic Publishers (1992).

FIG. 2 (Prior Art) is a simplified top-down diagram illustrating circuitry included on an FPGA integrated circuit to facilitate the programming of selected antifuses. After the programming of the selected antifuses, the programming circuitry is disabled and does not affect the logical function of the user-specific circuit programmed into the FPGA. In FIG. 2, a horizontal programming pass transistor 16, 17 and 18 is disposed around each horizontal pass antifuse 8, 19 and 20, respectively. The horizontal antifuses, horizontal pass transistors disposed around them, and the associated horizontal wires together form what is called a "string". If, for example, antifuse 19 is to be programmed, then the pass transistor 17 corresponding to antifuse 19 is turned off and the other pass transistors of the string are turned on. As illustrated, the programming pass transistors are controlled to be on or off by a programming control circuit 21A. The programming control circuit 21A may be thought of as a shift register having a plurality of bits (including bits 22–24), which correspond with a plurality of control conductors (including conductors 25–27). There are four such programming control circuits 21A, 21B, 21C and 21D associated with the upper left hand portion of the FPGA illustrated in FIG. 2.

In addition to controlling control conductors, the programming control circuits control programming driver circuits. Bit 30 of programming control circuit 21B is shown controlling a programming driver 31 and bit 32 of programming control circuit 21C is shown controlling a programming driver 33. Loading a digital one into a bit of a programming driver enables the corresponding programming driver whereas loading a digital zero into the bit of the programming control circuit disables the corresponding programming driver. The programming drivers which are enabled either output programming voltage Vpp or ground potential GND depending on the value of a control word stored in another shift register (not shown) associated with the programming control circuit. In the example of FIG. 2, there is one control word associated with programming control circuit 21B and another control word associated with programming control circuit 21C.

FIG. 3 (Prior Art) illustrates the programming of horizontal pass antifuse 19. Programming drivers 31 and 33 are enabled by loading bits 30 and 32 with digital ones, respectively. Programming driver 31 is made to drive wire 34 with programming voltage Vpp by loading the shift register (not shown) associated with programming control circuit 21B with an appropriate control word thereby causing programming driver 31 to output programming voltage Vpp when enabled. Similarly, programming driver 33 is made to drive wire 35 with ground potential GND by loading an appropriate control word into the shift register (not shown) associated with programming control circuit 21C. The bits of programming control circuit 21A which control the horizontal pass transistors of the string containing antifuse 19 are loaded to make all the horizontal pass transistors of the string conductive except for pass transistor 17. As a result, programming voltage Vpp develops across antifuse 19, a programming current flows through antifuse 19, and antifuse 19 is programmed. Although FIG. 2 shows only one horizontal string of horizontal wires, antifuses, and horizontal pass transistors for clarity of illustration, FPGA 1 has multiple horizontal strings and multiple vertical strings.

FIG. 4 (Prior Art) illustrates the programming of a cross antifuse. To program cross antifuse 9, the horizontal pass transistors 16, 17 and 18 in the horizontal string containing horizontal wire 13 are controlled to be conductive. Similarly, the vertical pass transistors 36 and 37 in the vertical string containing vertical wire 14 are controlled to be conductive. Programming driver 38 is controlled to output programming voltage Vpp and programming driver 33 is controlled to output ground potential GND. Accordingly, the programming voltage develops across antifuse 9 and a programming current flows through antifuse 9, and antifuse 9 is programmed.

FIG. 4 also illustrates how the other vertical strings are controlled so as not to program other cross antifuses 39, 40 and 41 by error. Three other vertical strings are illustrated in with dashed lines. In this architecture, the horizontally extending control conductors 42 and 43 which control vertical pass transistors 37 and 36 also extend horizontally and are coupled to corresponding vertical pass transistors in each of the successive vertical strings. Accordingly, controlling the vertical pass transistors to couple the output of the programming driver 38 of the leftmost vertical string to vertical wire 14 will also control the vertical pass transistors of the other vertical strings to couple the outputs of their respective programming drivers 44–46 to their respective corresponding vertical wires 47–49. Disabling programming drivers 44–46 to output an intermediate voltage such as Vpp/2 regardless of the value of the associated control word ensures that an adequately large voltage cannot develop across cross antifuses 39–41 to program them. Although FIG. 4 only shows only one horizontal string to clarify the illustration, FPGA 1 has multiple such horizontal strings wherein the gates of corresponding horizontal pass antifuses are connected to the same vertically extending control conductor.

After the user has created a schematic of the user-specific circuit to be programmed into the FPGA, a "place and route" software program "places" circuit components (such as gates and flip-flops) of the circuit in the various modules of the FPGA. The components in the schematic may be altered while maintaining the same logic functionality in order to achieve a better placement. A technology mapping method as set forth in U.S. patent application Ser. No. 08/231,595 entitled "Select Set-Based Technology Mapping Method And Apparatus" may be employed. The place and route software also "routes" the components in the modules together by determining which of the wires of the FPGA are to be connected together by which antifuses in order to realize the user-specific circuit. The result of the place and route is a placement of components in modules and a list of antifuses to be programmed. Antifuses not in the list either are optionally programmed or must not be programmed. It may not, however, be possible to program all the antifuses of the list without programming other antifuses not to be programmed if antifuses in the list are programmed in the wrong order.

FIG. 5 illustrates a situation in which an antifuse Z in the architecture cannot be programmed without also programming antifuse L which is not to be programmed. In this example, antifuses X, Y and Z are in the list of antifuses to be programmed but antifuse L is not in that list. Assume that antifuses X and Y are already programmed. To program antifuse Z, vertical pass transistor 50 must be turned on. Due to the connection of the gates of vertical pass transistors 50 and 51, however, both vertical pass transistors are turned on if one of them is turned on. Accordingly, if vertical wire 52 is driven with programming voltage Vpp in order to drive vertical wire 53 with programming voltage Vpp, then the programming voltage will also be present on vertical wire 54. Programming voltage Vpp will be conducted from vertical conductor 52, through already programmed antifuse Y, through horizontal wire 55, through already programmed antifuse X, through vertical wire 56, through conductive vertical pass transistor 51 and to vertical wire 54. If horizontal wire 57 is driven with ground potential GND to develop a programming voltage Vpp across antifuse Z, then the same programming voltage Vpp will be developed across antifuse L. Accordingly, this sequence of programming of antifuses, X-Y-Z, results in the inadvertent programming of an antifuse which is not to be programmed.

There does, however, exist a programming sequence in which all antifuses X, Y and Z in the list can be programmed without inadvertently programming antifuse L. FIGS. 6A, 6B and 6C illustrate this sequence. If antifuse Y is programmed first and antifuse Z is programmed second, then vertical pass transistors 50 and 51 can be nonconductive during the programming of the last antifuse, antifuse X. Accordingly, the programming voltage Vpp is prevented from passing through vertical pass transistor 51 and onto vertical wire 54 and ground potential GND is prevented from passing through vertical pass transistor 50 to vertical wire 53, already programmed antifuse Z, and horizontal wire 57. Accordingly, antifuse X can be programmed without inadvertently also programming antifuse L.

A "sequencer" method is therefore utilized to determine a sequence of antifuse programming which will allow all antifuses in the list to be programmed without inadvertently programming antifuses which are not in the list. With this sequence determined, the antifuses in the list are physically programmed one by one in sequence thereby programming the FPGA to realize the user-specific circuit. After antifuse programming, all programming pass transistors are controlled to be nonconductive. The result is an interconnect structure of wires and programmed antifuses which couples selected components in selected modules together in a desired fashion to form the user-specific circuit. As improvements in semiconductor processing technology have been made over the years, the number of antifuses in FPGAs has increased. An FPGA today may include approximately 500 thousand antifuses. Assuming that approximately 10–20 thousand of the 500 thousand antifuses in an FPGA are to be programmed to realize a user-specific circuit, and assuming that approximately 50–100 milliseconds is required to program each antifuse, then approximately 12 minutes are required to program a single FPGA if antifuses are programmed one after another. It would therefore be desirable to be able to program multiple antifuses in an FPGA simultaneously so as to reduce programming time. As the number of antifuses in FPGAs increases in the future, this need to reduce programming time is anticipated to become more acute. Accordingly, a method of determining a sequence of antifuse programming is sought by which multiple antifuses can be programmed simultaneously without the programming of other antifuses which are not to be programmed.

SUMMARY

A sequence of antifuses to be programmed is determined by: determining whether a first antifuse of a list of antifuses to be programmed could be programmed last without programming any antifuses which are not to be programmed, determining whether a second antifuse of the list could be programmed last without programming any antifuses which are not be programmed, and determining whether the first and second antifuses could be programmed simultaneously but after other antifuses in the list and without programming any antifuses which are not to be programmed.

In some embodiments, a group of antifuses (called a programming set) which could be programmed simultaneously is determined. Once determined, the antifuses making up the programming set are added to the head of an ordered list and are removed from the list of antifuses to be programmed. Using the now smaller list of antifuses to be programmed, another programming set of antifuses is determined. The antifuses making up the second programming set are then added to the head of the ordered list and are removed from the list of antifuses to be programmed. By repeatedly determining programming sets of antifuses and adding each successive set of antifuses to the head of the ordered list of antifuses, an antifuse programming sequence is developed. An FPGA is programmed by programming sets of antifuses in the ordered list in order, the programming set at the head of the ordered list being the first programming set to be programmed. All the antifuses in each programming set are programmed simultaneously thereby reducing the programming time required to program a user-specific circuit into an FPGA.

Tests are disclosed for determining whether an antifuse can be programmed last and for determining whether a programming set of antifuses can be programmed simultaneously. Other methods and structures associated with the simultaneous programming of antifuses are also disclosed.

BRIEF DESCRIPTION OF THE DRAWINGS

FIGS. 6A–6C illustrate a programming sequence in which all antifuses in a list of antifuses to be programmed can be programmed without programming any other antifuse which is not to be programmed.

FIGS. 7 and 7A–7B are a flowchart in accordance with an embodiment of the present invention in which an "ordered list" of antifuses to be programmed is determined from an "unordered list" of antifuses to be programmed.

DETAILED DESCRIPTION OF THE PREFERRED EMBODIMENTS

In the below description, antifuses of an integrated circuit are described as being physically "in" various lists and sets and as being moved by the sequencer method. It is to be understood that the antifuses are not physically disposed in lists and sets but rather that the lists and sets contain representations of the physical antifuses. Antifuses are, however, described as existing in lists and programming sets to simplify and clarify the explanation of the method.

Sequencer Method Flowchart

Figure 7A:
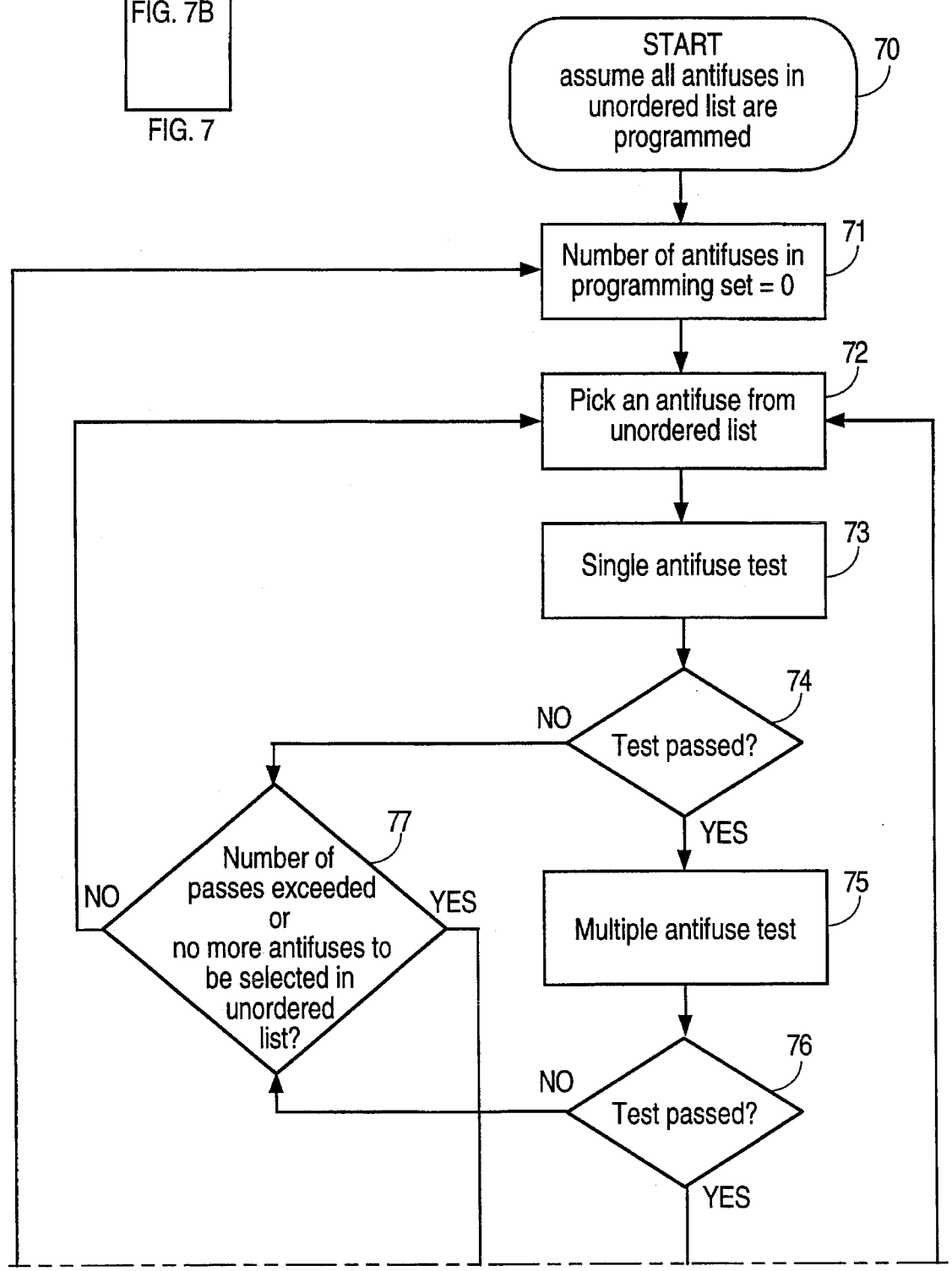
Figure 7B:
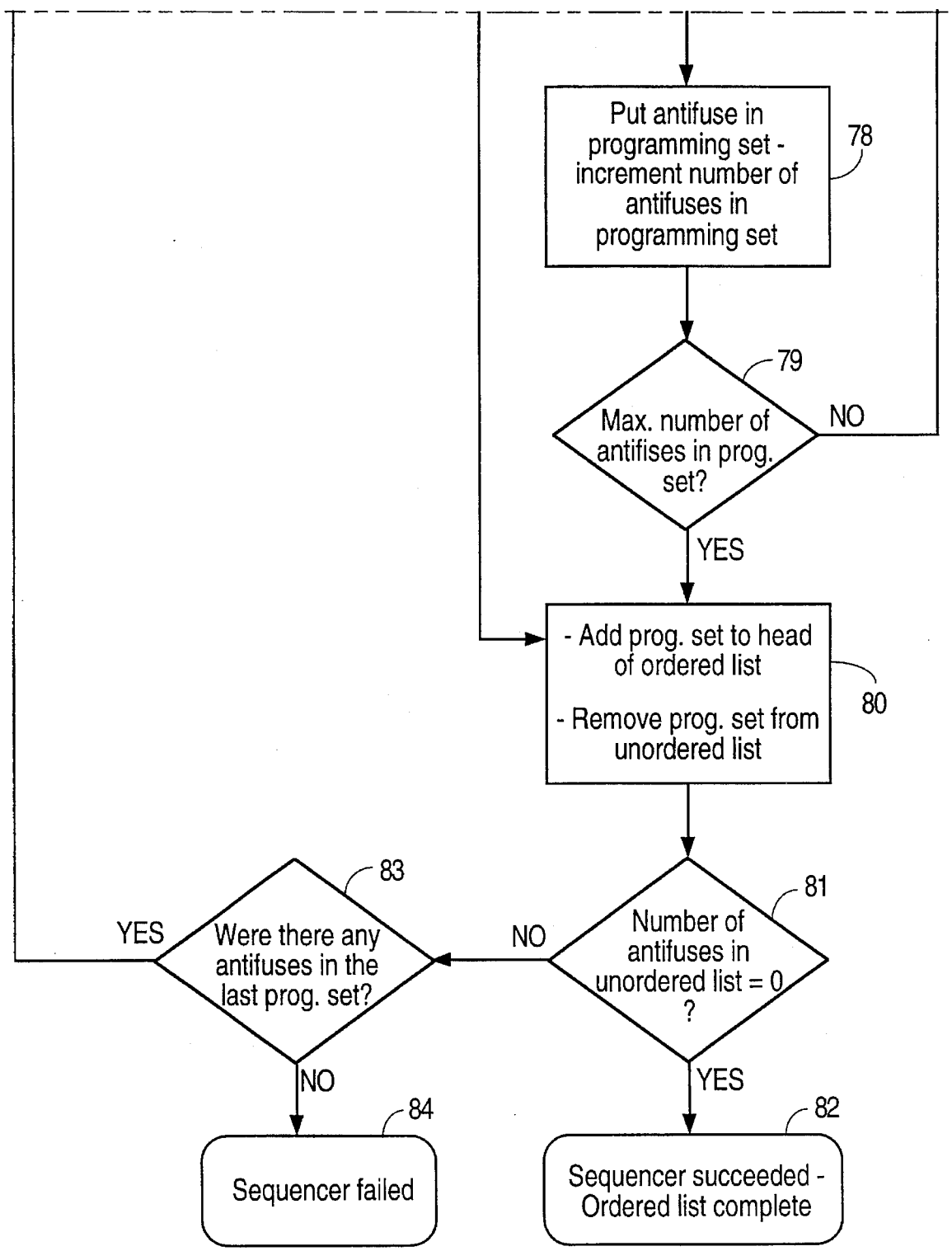

FIGS. 7A–7B are a flowchart in accordance with an embodiment of the present invention in which an "ordered list" (a sequence) of antifuses to be programmed is determined from an "unordered list" of antifuses to be programmed. The unordered list in one embodiment is an output of a "place and route" method wherein an interconnection of certain logic components in certain modules of the FPGA is determined which would realize a desired user-specific circuit.

First, all the antifuses in the unordered list are assumed to be programmed (step 70). This simulates the final chip after programming is complete. A number representing the number of antifuses in a "programming set" is initially zero (step 71). (Antifuses which are to be programmed together will be placed into the programming set.) One antifuse is then selected from the unordered list (step 72) and it is determined if that antifuse could be programmed last assuming that all the other antifuses of the unordered list are already programmed (step 73). The determination of whether an antifuse could be programmed last is called the "single antifuse test" and is described in further detail below.

If it is determined that the antifuse could be programmed last (step 74), then it is determined if the antifuse could be programmed simultaneously with all the other antifuses then in the programming set but after all other antifuses in the unordered list (step 75). This determination is called the "multiple antifuse test" and is described in further detail below. If there are no antifuses in the programming set, then the selected antifuse automatically passes the multiple antifuse test.

If, on the other hand, it is determined that the selected antifuse could not be programmed last or if the selected antifuse could not be programmed simultaneously with all the other antifuses in the programming set (step 77), then another antifuse is selected from the unordered list (step 72) and is tested with the "single antifuse test" and the "multiple antifuse test". In order to limit the amount of time required to build a programming set, the number of times that selected antifuses fail to pass either the "single antifuse test" or the "multiple antifuse test" during the building of a programming set is monitored. After a predetermined number of selected antifuses have failed (step 77), additional attempts to add antifuses to the programming set are not made.

If the selected antifuse passes both the "single antifuse test" and the "multiple antifuse test", then the antifuse is placed in the programming set (step 78). Provided that a maximum number of antifuses have not failed to meet the antifuse tests for entry into the programming set, steps 72–78 are repeated until the number of antifuses in the programming set is equal to a predetermined maximum number of antifuses to be programmed simultaneously.

If the maximum number of antifuses is present in the programming set (i.e., the programming set is filled) (step 79), then the antifuses in the programming set are added to the head of the "ordered list" (step 80) and removed from the unordered list. When the first programming set is added, the ordered list is empty.

If the number of antifuses in the unordered list is zero (all antifuses from the unordered list have been moved to the ordered list)(step 81), then the ordered list is completed (step 82). If, on the other hand, antifuses still remain in the unordered list, then it is determined if there are any antifuses in the last programming set (step 83). If there are no antifuses in the last programming set, this indicates that the previous attempt to select antifuses for programming last failed even though there are still antifuses in the unordered list. Because repeating the attempt to select antifuses for programming last will achieve the same result, the sequencer method has failed (step 84). If, on the other hand, there was at least one antifuse in the last programming set, then the unordered list was shortened and another attempt is made to find antifuses which can be programmed last by returning to step 71.

Single Antifuse Test

The selected antifuse under consideration is in contact with a first wire and a second wire. It is between these two wires that the programming voltage is developed. The single antifuse test is passed if neither of the following two conditions exists:

1) the first wire or any other wire electrically coupled to the first wire "crosses" the second wire or any wire electrically coupled to the second wire (except at the selected antifuse under consideration) during the anticipated programming of the selected antifuse under consideration.

2) the first wire "shorts" to the second wire during the anticipated programming of the selected antifuse under consideration.

The word "cross" here indicates that an antifuse is disposed with respect to the two wires such that the antifuse would be programmed if the programming voltage were applied between the two wires. Two adjacent collinear wires which have an intervening antifuse therefore "cross" each other as do a vertical wire and a horizontal wire which have a cross antifuse at the location where they cross each other. The word "short" here indicates that the first wire is electrically coupled to the second wire by any combination of programmed antifuses, wires, and/or conductive pass transistors. During the test, all antifuses then in the unordered list, except for the selected antifuse under consideration, are assumed to already be programmed.

Figure 1:
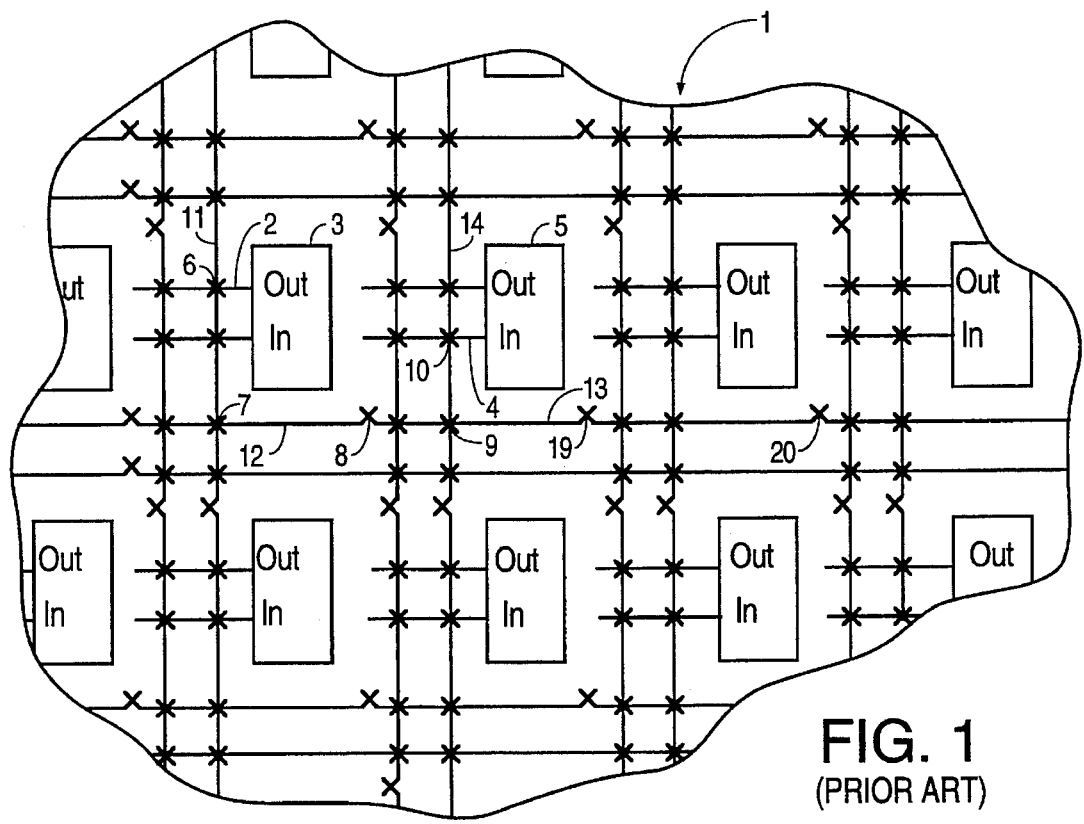
FIG. 1 (Prior Art) is a simplified top down diagram illustrating a center part of an FPGA.
Figure 2:
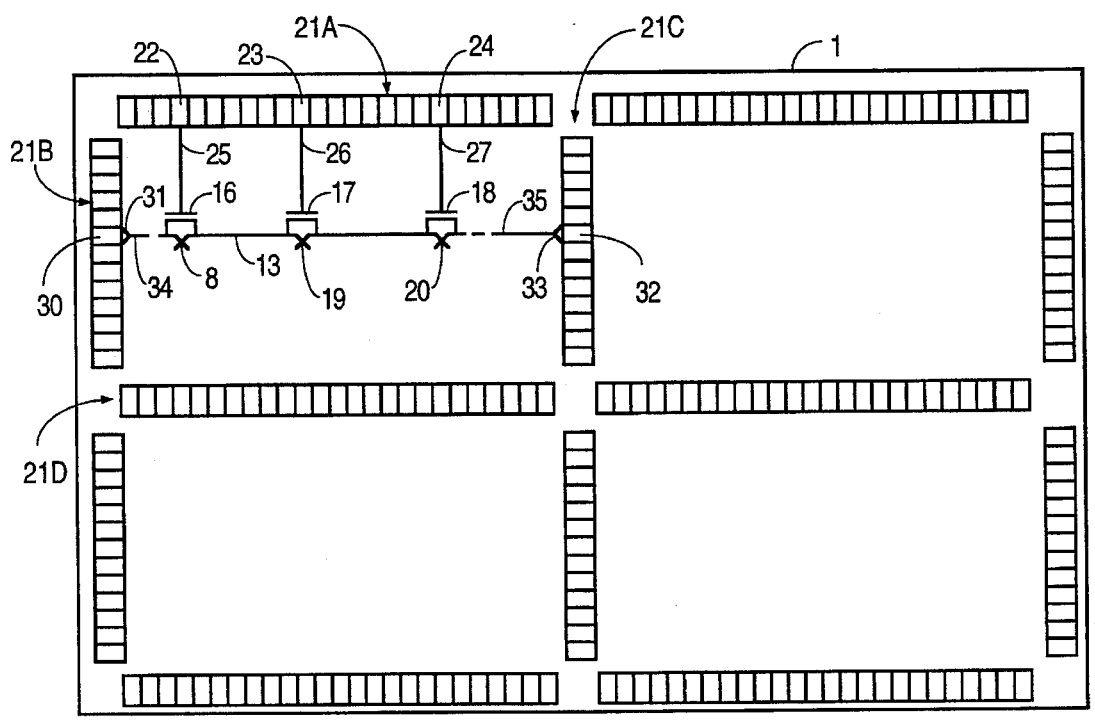
FIG. 2 (Prior Art) is a simplified top-down diagram illustrating circuitry included on the FPGA of FIG. 1 to facilitate the programming of antifuses.
Figure 3:
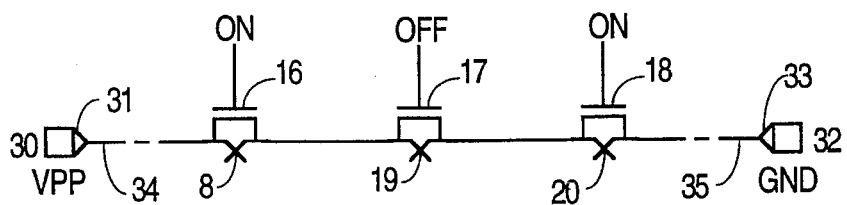
FIG. 3 (Prior Art) illustrates the programming of a horizontal pass antifuse.
Figure 4:
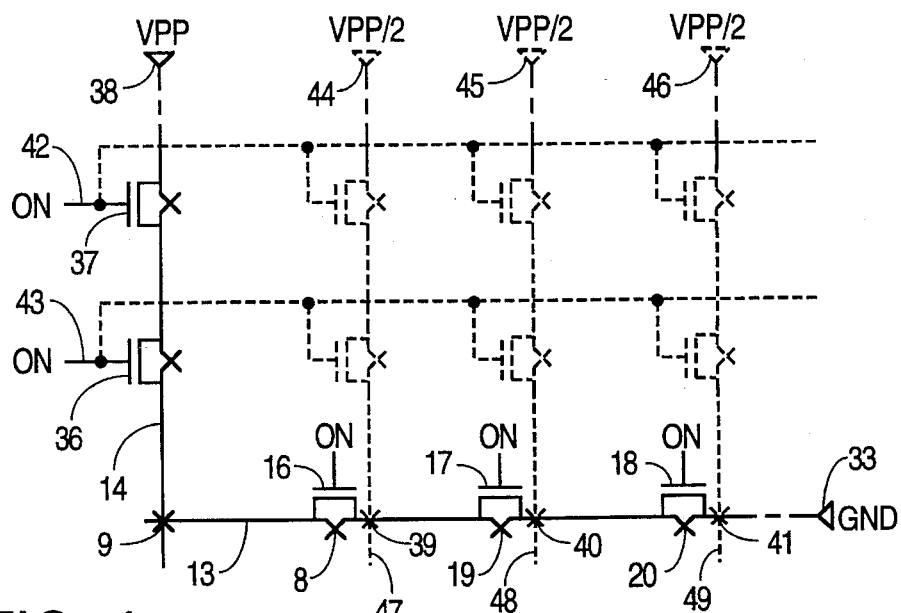
FIG. 4 (Prior Art) illustrates the programming of a cross antifuse.
Figure 5:
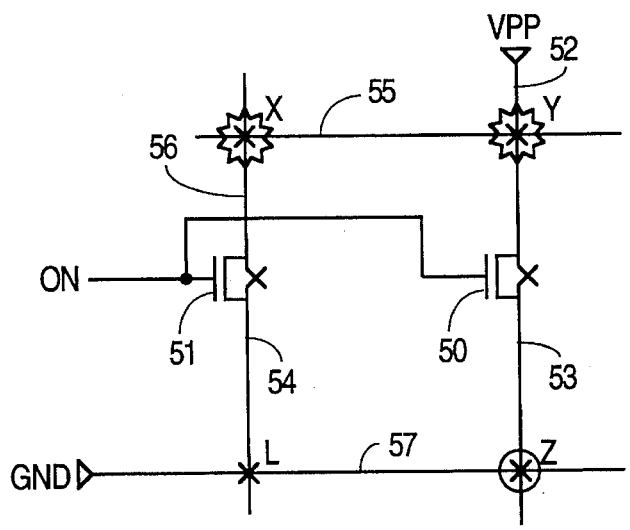
FIG. 5 illustrates a situation in which an antifuse cannot be programmed without also programming another antifuse which is not to be programmed.

FIG. 5 illustrates a situation in which the single antifuse test fails. Assuming that antifuses X and Y are already programmed, antifuse Z is selected. To program antifuse Z as illustrated, pass transistors 50 and 51 must be conductive. Assuming that wire 53 is the first wire, wire 53 and all the wires electrically coupled to wire 53 are "marked" with a first mark. This includes wire 53, wire 52, wire 55, wire 56, and wire 54. If wire 53 is the first wire, then wire 57 must be the second wire. Wire 57 and all wires coupled to it are therefore marked with a second mark. Wire 57 is the only wire with the second mark. Because wire 54 with the first mark "crosses" wire 57 with the second mark at antifuse L, the single antifuse test fails.

FIG. 6C illustrates a situation in which the single antifuse test passes. Antifuses Y and Z are assumed to already have been programmed. Antifuse X is selected. To program antifuse X as illustrated, pass transistors 50 and 51 are controlled to be nonconductive. Neither of the pass antifuses is already programmed in this example. Assuming that wire 55 is the first wire, wires 55 and 52 are marked with a first mark. Wire 53 is not marked with the first mark because pass transistor 50 is nonconductive, thereby isolating wire 53 from wire 52. Wire 56 is the second wire. Wire 56 is the only wire receiving the second mark because pass transistor 51 is nonconductive, thereby isolating wire 54 from wire 56. Because no wire with the first mark "crosses" any wire with the second mark, the first part of the single antifuse test passes. Because there is no wire which has both marks, the first and second wires of antifuse X are not "shorted" and the second part of the single antifuse test passes. Antifuse X can therefore be programmed last assuming that antifuses Y and Z are already programmed without inadvertently programming antifuse L which is not to be programmed. Antifuse X therefore passes the single antifuse test.

Multiple Antifuse Test

The selected antifuse under consideration is in contact with a first wire and a second wire. It is between these two wires that the programming voltage is developed. Each of the other antifuses in the programming set also has a first wire and a second wire. The multiple antifuse test is passed if none of the following conditions exists:

1) the first wire or any other wire electrically coupled to the first wire "crosses" either the first or second wires of any other antifuse in the programming set or "crosses" any wire electrically coupled to the first or second wires of any antifuse in the programming set.

2) the second wire or any other wire electrically coupled to the second wire "crosses" either the first or second wires of any other antifuse in the programming set or "crosses" any wire electrically coupled to the first or second wires of any antifuse in the programming set.

3) the first wire or any other wire electrically coupled to the first wire "shorts" to either the first or second wires of any other antifuse in the programming set or "shorts" to any of the wires electrically coupled to the first or second wires of any other antifuse in the programming set.

4) the second wire or any other wire electrically coupled to the second wire "shorts" to either the first or second wires of any other antifuse in the programming set or "shorts" to any of the wires electrically coupled to the first or second wires of any other antifuse in the programming set.

5) The first wire of the selected antifuse or any other wire electrically coupled to the first wire either "shorts" to or "crosses" the second wire of the selected antifuse or any other wire electrically coupled to the second wire. This condition is different from conditions one and two of the single antifuse test because the programming pass transistors necessary to program all the antifuses in the programming set are assumed to be turned on as opposed to only the programming pass transistors necessary to program the selected antifuse as in the single antifuse test.

6) no two antifuses in the programming set are to be programmed with programming drivers controlled by the same "control circuit group".

During the multiple antifuse test, all antifuses then in the unordered list are assumed to be programmed, except for the antifuses in the programming set.

In some embodiments, placing a digital one in a bit of a programming control circuit which controls a programming driver enables the programming driver to output either programming voltage Vpp or ground potential GND, whereas placing a digital zero in the bit causes the programming driver to be disabled, allowing an intermediate voltage such as Vpp/2 to remain on the wire. Accordingly, bits containing digital ones are considered to enable their programming drivers whereas bits containing digital zeros are considered to disable their programming drivers. Which particular voltage (Vpp or GND) the enabled programming drivers output is, however, determined by a "control word". This control word is loaded into and stored in a separate shift register used for antifuse programming. If the control word is a digital one, for example, then all enabled programming drivers controlled by the control word will output the programming voltage Vpp. If the control word is a digital zero, then all enabled programming drivers controlled by the control word will output ground potential GND.

If each programming control circuit is controlled by a separate control word, then each programming control circuit is a different "control circuit group". In some embodiments, however, a programming control circuit is comprised of parts, each part being controlled by a separate control word. In such a case, there will be more "control circuit groups" than the number of programming control circuits.

Figure 8:
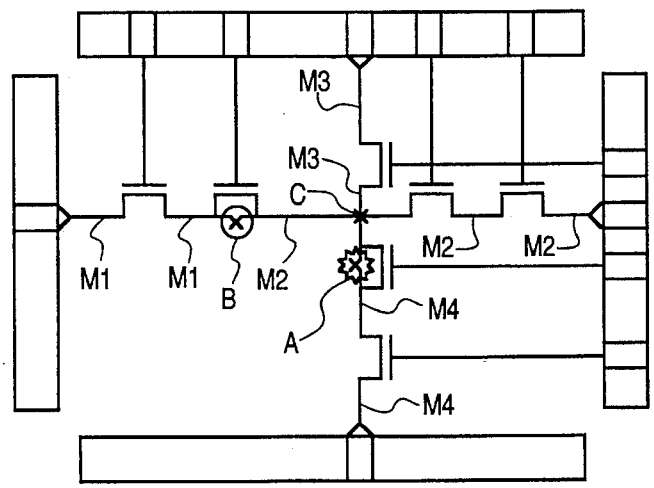
FIGS. 8–10 illustrate situations in which selected antifuses fail to pass a "multiple antifuse test" in accordance with an embodiment of the present invention.

FIG. 8 illustrates a situation in which the multiple antifuse test fails. In this example, antifuse A is already in the programming set. Antifuse B is selected and passes the single antifuse test. Antifuse B, however, fails the multiple antifuse test. There are four marks, M1, M2, M3 and M4. M2 "crosses" M3 at cross antifuse C. The multiple antifuse test fails and antifuse B is not added to the programming set.

Figure 9:
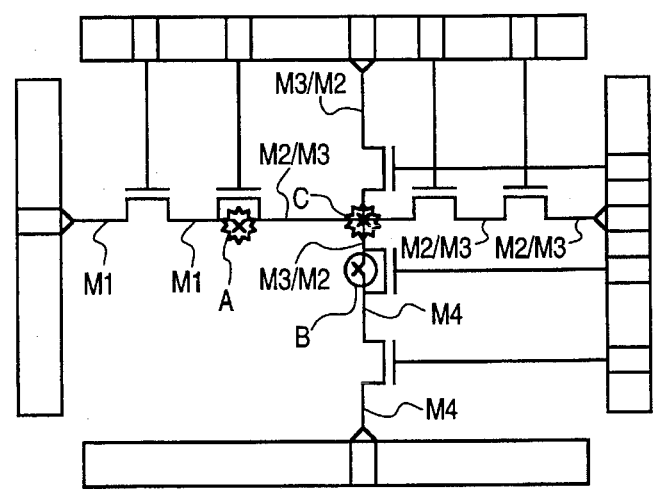

FIG. 9 illustrates another situation in which the multiple antifuse test fails. In this example, antifuse A is already in the programming set. Antifuse C of the unordered list is assumed to have been already programmed. Antifuse B is selected and passes the single antifuse test. Antifuse B, however, fails the multiple antifuse test. There are four marks, M1, M2, M3 and M4. Marks M2 and M3 overlap indicating that a wire of antifuse A "shorts" to a wire of antifuse B.

Figure 10:
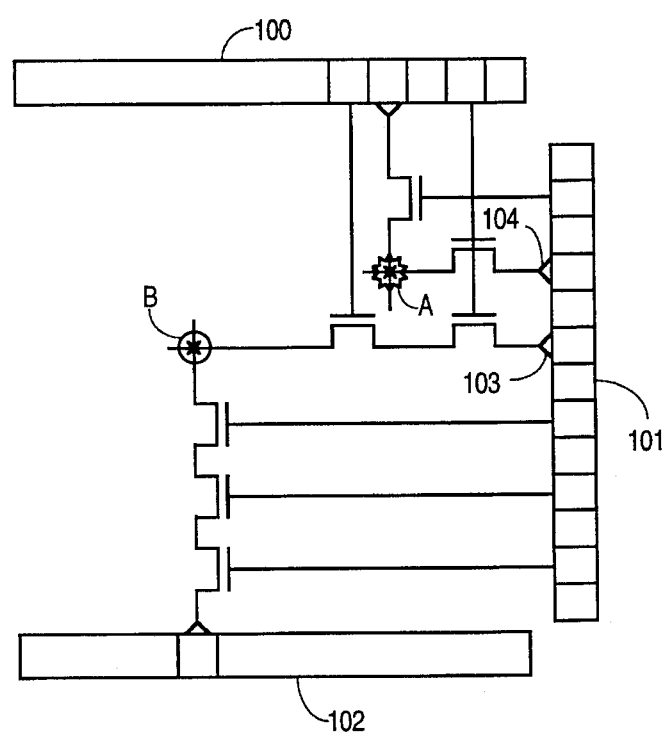

FIG. 10 illustrates another situation in which the multiple antifuse test fails. In this example, antifuse A is already in the programming set. Programming control circuit 100 is controlled by a single control word and therefore constitutes a first "control circuit group". Programming control circuit 101 is controlled by a single control word which is different from the control word of programming control circuit 100 and therefore constitutes a second "control circuit group". Similarly, programming control circuit 102 is controlled by a single control word which is different from the other two control words. Programming control circuit 102 therefore constitutes a third "control circuit group". Antifuse B is selected and passes the single antifuse test. No marked wires of antifuses A and B either cross or short each other. Two of the four programming drivers which would be used to program antifuses A and B simultaneously are, however, controlled by the same "control circuit group". The multiple antifuse test therefore fails and antifuse B is not added to the programming set.

In the example, programming control circuit 101 constitutes only one control circuit group. In other embodiments, a first part of programming control circuit 101 may be controlled by a first control word and a second part of programming control circuit may be controlled by a second control word. If, for example, programming driver 103 were controlled by the first part of the programming control circuit and if programming driver 104 were controlled by the other part, and if the two control words of programming control circuit 101 could be different from the control words of programming control circuits 100 and 102, then the multiple antifuse test would not have failed due to programming drivers 103 and 104 being controlled by the same "control circuit group".

In FIGS. 8–10 only selected strings, cross antifuses and programming drivers are illustrated in order to simplify and clarify the drawings. Each horizontal and vertical pass transistor has a corresponding pass antifuse. There may be numerous vertical and numerous horizontal strings. The strings may include many more pass transistors and wires than are illustrated in the simplified drawings. Some control conductors controlling some pass transistors of a string may extend to one programming control circuit whereas other control conductors controlling other pass transistors of the string may extend to another programming control circuit. It is therefore understood that FIGS. 8–10 illustrate a subset of the structure of one possible embodiment of a programmable device which is programmable in accordance with the present invention.

In some embodiments, rather than removing selected antifuses and placing them in the programming set before the "single antifuse test" and the "multiple antifuse test" are performed on these antifuses, execution of the sequencer method is speeded by leaving antifuses which are placed in the programming set in the unordered list until after all antifuses in the programming set have passed the "single antifuse test" and the "multiple antifuse test". Determining a sequence of antifuse programming is also facilitated by taking advantage of the fact that certain antifuses may exist which are not in the unordered list but which may nevertheless be optionally programmed. Antifuses are therefore classified into three classes: antifuses which must be programmed, antifuses which may optionally be programmed, and antifuses which must not be programmed. In some embodiments, the "single antifuse test" and "multiple antifuse test" do not fail if an optionally programmed antifuse would be programmed. Accordingly, some selected optionally programmed antifuses may initially be placed in the unordered list at the beginning of the sequencer method.

Although the possible programming of each selected antifuse in the drawings involves only two programming drivers, the sequencer method can be practiced using three or more programming drivers in accordance with the techniques set forth in U.S. Pat. No. 5,327,024 (the contents of which are incorporated herein by reference). In some embodiments of the present invention, antifuses to be programmed which are disposed in speed critical nets are identified. When these antifuses are selected for possible addition to a programming set, a high programming current programming method (such as a programming method involving three or more programming drivers and three or more programming current branches) is assumed to be used. In some embodiments, such antifuses in speed critical nets are selected early in the building of the ordered list because the high programming current methods used to program them usually involve many programming current branches and therefore tend to cause the selected antifuse to fail the tests of steps 73 and 75.

The basic sequencer method set forth in FIGS. 7A–7B may be further embellished. In some embodiments, FPGA 105 is comprised of a plurality of zones with various degrees of isolation existing between the various zones. Zone 106 in FIG. 11 has a relatively high degree of isolation with respect to zone 107 because any antifuse selected in zone 106 will be driven by a programming driver controlled by a different "control circuit group" than any antifuse located in zone 107. Zone 108 has a lesser degree of isolation with respect to zone 106 because some antifuses in the two zones 106 and 108 may share one common "control circuit group" 109. Similarly, zone 110 has a similar lesser amount of isolation with respect to zone 106.

Figure 11:
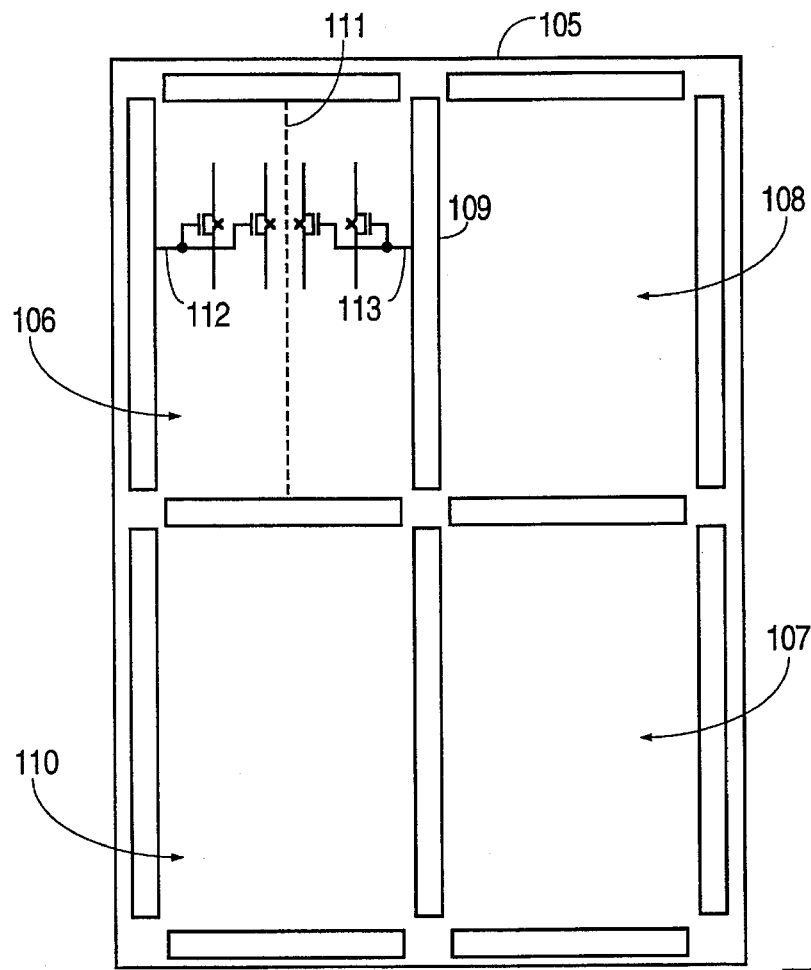
FIG. 11 illustrates a plurality of isolation zones of an integrated circuit in accordance with some embodiments of the present invention.

In some embodiments, programming control circuits such as programming control circuit 109 in FIG. 11 divide the integrated circuit into a plurality of sections. Each of these sections comprises a plurality of isolation zones. In FIG. 11, the corresponding programming pass transistors in the left half portion of the upper left section to the left of dashed line 111 are controlled by a common control conductor 112 whereas the corresponding programming pass transistors in the vertical strings in the upper left section to the right of dashed line 111 are controlled by another common control conductor 113. Providing separate control conductors provides an additional type of isolation so that the upper left section of FPGA 105 comprises two isolation zones.

The various types of isolation are used in one embodiment of the method of FIGS. 7A–7B. After the selection of the first antifuse of a programming set, the subsequent antifuses selected for possible addition to the programming set are selected randomly from zones of all different degrees of isolation. Selecting the subsequent antifuses from only relatively highly isolated zones may consume all such highly isolated antifuses and therefore may result in an imbalance of antifuses if such highly isolated antifuses would have been better utilized subsequently in the method. On the other hand, selecting all the subsequent antifuses from the same zone as the first antifuse may cause a large percentage of the subsequently selected antifuses to fail the tests in steps 73 and 75.

Accordingly, after a predetermined number M of failures at step 77, subsequent antifuses for possible addition into the programming set are selected from the most highly isolated zone. After all such antifuses are consumed, subsequent antifuses for possible addition into the programming set are selected from the next most isolated zone and so forth until the programming set is complete or until steps 73 and 75 have failed more than N times (the result of the decision block of step 77 is true). The values for M and N are empirically determined using specific designs as benchmarks.

Because the amount of time required to program all the antifuses in a programming set simultaneously is determined by the antifuse in the programming set which requires the greatest amount of time to program, step 72 in the flowchart of FIGS. 7A–7B may involve an additional antifuse selection criteria. Initially, all antifuses to be programmed are classified according to the amount of time required to program each antifuse. Subsequently when step 72 is carried out, only similarly classified antifuses are selected for possible inclusion into the programming set. In this way, the total amount of time required to program all the antifuses to be programmed is reduced. In other embodiments, antifuses are not initially classified by the amount of time required to program them but rather each selected antifuse is rejected as a candidate for entry into the programming set if the amount of programming time required to program it is significantly different from the amount of programming time required to program existing members of the programming set.

In accordance with some embodiments of the present invention, the pass antifuses to be programmed are programmed before cross antifuses to be programmed. The pass antifuses are programmed first because programming of a pass antifuse does not require the programming pass transistor disposed around it to be turned on. This decreases the number of wires charged with programming voltage Vpp or ground potential GND during programming. Accordingly, the unordered list is initially sorted so that the pass antifuses are relocated to the tail of the unordered list. Doing so enables the pass antifuses to be selected last in the sequencer method. It makes the pass antifuses more likely to be programmed before the cross antifuses.

Figure 12:
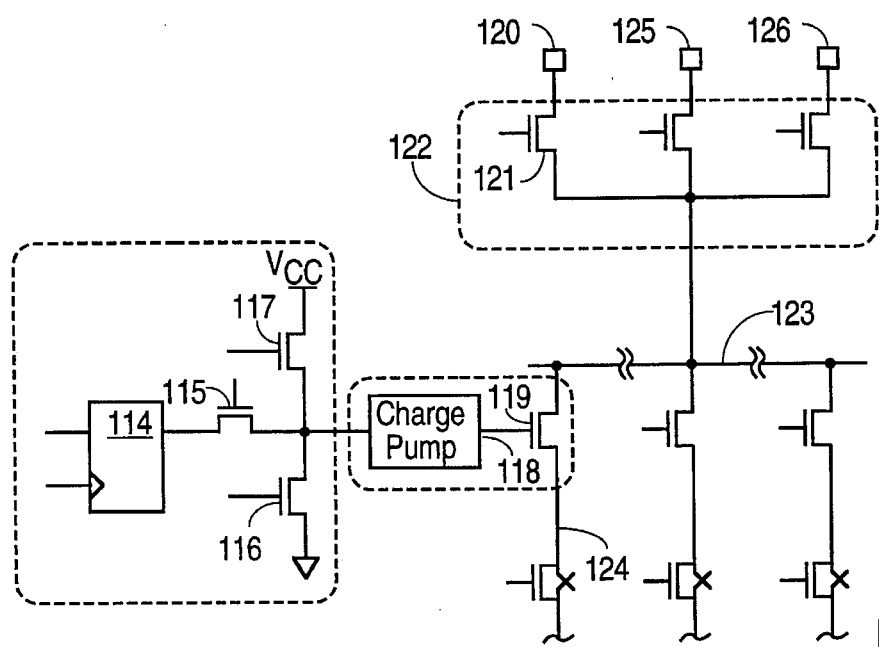
FIG. 12 is a circuit diagram showing an embodiment of a bit of a programming control circuit controlling a programming driver in accordance with the present invention.

FIG. 12 is a circuit diagram showing how a bit of a programming control circuit and its corresponding programming driver are implemented in accordance with some embodiments of the present invention. For additional information, see U.S. patent application Ser. No. 08/349,093, entitled "Integrated Circuit Facilitating Simultaneous Programming of Multiple Antifuses", filed Dec. 1, 1994, by Paige A. Kolze (the contents of which are incorporated herein by reference). Flip-flop 114 and transistors 115 through 117 together comprise a bit of the programming control circuit. Charge pump 118 and transistor 119 together comprise the associated programming driver. In this embodiment, the programming driver does not output voltage Vpp/2 at all times when the bit of the programming control circuit contains a digital zero. When the contents of the various bits of the programming control circuit are being shifted in to the respective bits of the programming control circuit, transistor 117 is controlled to be conductive and transistor 115 is controlled to be nonconductive so that a digital high voltage is supplied through transistor 117 and charge pump 118 to turn on transistor 119 of the programming driver. When the contents of the programming control circuit are being shifted in, a voltage of Vpp/2 can be applied to terminal 120 of the integrated circuit. By turning transistor 121 of the programming current multiplexer circuit 122 on, the voltage Vpp/2 from terminal 120 is conducted through transistor 121 and onto programming bus 123. Accordingly, wire 124 and all corresponding wires of other strings are precharged to the voltage Vpp/2 when the bits of the programming control circuit are being loaded. Although not specifically shown in FIG. 12, another bit of the programming control circuit and another charge pump is associated with each respective other transistor corresponding to transistor 119 in the other strings.

After bit 114 is loaded, transistors 117 and 116 are controlled to be non-conductive and transistor 115 is controlled to be conductive so that the contents of bit 114 enable or disable the programming driver. The programming driver is enabled when a voltage of either Vpp or ground is supplied from one of the terminals 120, 125 and 126 onto wire 124. If, on the other hand, the programming driver is disabled, then wire 124 maintains its precharge voltage of Vpp/2. With the structure of FIG. 12, terminal 120 is only supplied with voltage Vpp/2 during loading of the bits of the programming control circuit. After loading, terminal 120 used for other purposes. Transistor 116 is provided to disable the programming driver during test.

Although embodiments of the present invention have been described for instructional purposes in order to illustrate the present invention, the present invention is not limited thereto. Multiple antifuses can be programmed simultaneously in devices not having programming pass transistors and not having the type of programming control circuitry set forth in connection with the specific embodiments. See, for example, the architecture set forth in U.S. patent application Ser. No. 08/246,527 entitled "Programmable Application Specific Integrated Circuit Having Antifuses And Methods Therefor" (the contents of which are incorporated herein by reference). Although antifuses are described as being programmed when programming voltage Vpp is present on one antifuse electrode and ground potential GND is present on the other electrode, it is understood that an antifuse will typically begin to conduct and therefore program with a voltage of magnitude less than Vpp across its electrodes. Any suitable antifuse structure can be programmed in accordance with the present invention including, but not limited to, amorphous silicon antifuses and oxide-nitride-oxide antifuses. Accordingly, various adaptations, modifications and substitutions of various of the features of the specific embodiments described herein can be practiced without departing from the scope of the invention as defined by the appended claims.

What is claimed is:

1. A method of programming a first plurality of antifuses to be programmed of an integrated circuit, said integrated circuit also comprising a second plurality of antifuses which are not to be programmed, comprising the steps of:

(a) determining whether a first antifuse of said first plurality of antifuses can be programmed after all of the other of said first plurality of antifuses are programmed but without programming any of said second plurality of antifuses;

(b) determining whether a second antifuse of said first plurality of antifuses can be programmed after all of the other of said first plurality of antifuses are programmed but without programming any of said second plurality of antifuses;

(c) if said first antifuse can be programmed last and if said second antifuse can be programmed last, determining whether said first and second antifuses can be programmed simultaneously without programming any of said second plurality of antifuses; and (d) programming said first and second antifuses simultaneously after all of the other antifuses of the first plurality of antifuses are programmed.

2. The method of claim 1, wherein step (c) comprises the steps of:

identifying all the conductors in a conductor group A which would be coupled to a first electrode of said first antifuse if said first antifuse were programmed;

identifying all the conductors in a conductor group B which would be coupled to a second electrode of said first antifuse if said first antifuse were programmed;

identifying all the conductors in a conductor group C which would be coupled to a first electrode of said second antifuse if said second antifuse were programmed;

identifying all the conductors in a conductor group D which would be coupled to a second electrode of said second antifuse if said second antifuse were programmed; and determining that said first and second antifuses cannot be programmed simultaneously if an antifuse other than said first and second antifuses is disposed between any conductor in one of said conductor groups A–D and any conductor in any other one of said conductor groups A–D.

3. The method of claim 1, wherein said integrated circuit comprises a plurality of control circuit groups, each of said control circuit groups controlling a corresponding plurality of programming drivers, wherein step (c) comprises the steps of:

identifying the programming drivers which would be used to program said first and second antifuses; and determining that none of said programming drivers which would be used to program said first and second antifuses is controlled by the same control circuit group that controls any other of said programming drivers which would be used to program said first and second antifuses.

4. The method of claim 3, wherein the programming drivers controlled by a control circuit group are controllable to output either a programming voltage Vpp or ground potential GND substantially independently of the voltages being output by the programming drivers controlled by any other control circuit group.

5. The method of claim 4, wherein the programming drivers controlled by a control circuit group can be enabled or disabled, each programming driver outputting an intermediate voltage if disabled, each programming driver outputting either the programming voltage Vpp or ground potential GND if enabled depending on a control word associated with said control circuit group.

6. The method of claim 1, wherein said integrated circuit also comprises a third plurality of antifuses which need not be programmed to realize a user-specific circuit but which may optionally be programmed.

7. A method of programming an integrated circuit having a first plurality of antifuses which are to be programmed, said first plurality of antifuses being classifiable into a first group, a second group and a third group such that antifuses in said second group have a greater degree of isolation with respect to antifuses in said first group than antifuses in said third group have with respect to antifuses in said first group, the method comprising the steps of:

(a) selecting a first antifuse from said first group; and (b) selecting the next antifuse from said second group and not from said third group or from said first group; and (c) determining whether said first and next antifuse can be programmed simultaneously without programming any antifuse of a second plurality of antifuses of said integrated circuit which are not to be programmed.

8. The method of claim 7, wherein said integrated circuit is comprised of a matrix of rows and columns of isolation zones, all the antifuses of the first group being disposed in a first isolation zone and all the antifuses of the second group being disposed in a second isolation zone, the second isolation zone being in a different column and different row than said first isolation zone.

9. The method of claim 8, wherein each respective pair of isolation zones in a row of isolation zones of said integrated circuit is separated by a respective one of a corresponding plurality of programming control circuits.

10. A method, comprising the steps of:

reordering a list of antifuses to be programmed by placing antifuses of said list which are of a predetermined type towards one end of said list;

performing a sequencer method on said list after reordering thereby generating an ordered list of said antifuses to be programmed; and programming said antifuses in said ordered list, wherein said sequencer method involves the simultaneous programming of multiple antifuses.

* * * * *